(12) United States Patent
Zhang et al.

(10) Patent No.: US 11,331,682 B2
(45) Date of Patent: May 17, 2022

(54) VISUAL INSULATING SPRAY LANCE FOR LIVE WORKING

(71) Applicant: Henan Heng'an Power Co., Ltd., Zhengzhou (CN)

(72) Inventors: Ping'an Zhang, Zhengzhou (CN); Yu Wang, Zhengzhou (CN); Dabo Guo, Zhengzhou (CN); Jianfei Wang, Zhengzhou (CN); Pin Liu, Zhengzhou (CN); Yong Wang, Zhengzhou (CN); Chaofei Wang, Zhengzhou (CN); Yuezhi Liu, Zhengzhou (CN); Zhanxia Kou, Zhengzhou (CN)

(73) Assignee: HENAN HENG'AN POWER CO., LTD., Henan (CN)

( * ) Notice: Subject to any disclaimer, the term of this patent is extended or adjusted under 35 U.S.C. 154(b) by 0 days.

(21) Appl. No.: 17/024,381

(22) Filed: Sep. 17, 2020

(65) Prior Publication Data

US 2021/0107018 A1     Apr. 15, 2021

(30) Foreign Application Priority Data

Oct. 15, 2019   (CN) .......................... 201910976695.X

(51) Int. Cl.
    *B05B 5/053*     (2006.01)
    *B05B 12/00*     (2018.01)
    *H05K 13/00*     (2006.01)

(52) U.S. Cl.
    CPC ............ *B05B 5/053* (2013.01); *B05B 12/002* (2013.01); *B05B 12/004* (2013.01); *H05K 13/0007* (2013.01)

(58) Field of Classification Search
    CPC ..... B05B 5/053; B05B 12/002; B05B 12/004; B05B 15/62; B05B 7/062; B05B 7/12; B05B 7/0815; B05B 7/0861; B05B 15/00; H05K 13/0007; H04N 7/18
    See application file for complete search history.

(56) References Cited

U.S. PATENT DOCUMENTS

| | | | |
|---|---|---|---|
| 7,617,997 B2 * | 11/2009 | Nagai ................... | B05B 5/0407 118/620 |
| 9,930,294 B2 * | 3/2018 | Hasegawa ............. | G06T 7/0012 |
| 10,046,343 B2 * | 8/2018 | Mickols ................ | B05B 5/0532 |

(Continued)

*Primary Examiner* — Qingzhang Zhou
(74) *Attorney, Agent, or Firm* — Tarolli, Sundheim, Covell & Tummino LLP

(57) ABSTRACT

Provided is a visual insulating spray lance for live working. A liquid guide tube and an air tube in a hollow operating rod are communicated with an inlet end of a spray nozzle; the operating rod is connected to a connecting rod and a display respectively through a fastener; a video optical transceiver fixedly arranged on the connecting rod is connected to the display through an optical fiber; the optical fiber is connected to an optical receiver, the optical receiver is connected to a chip for a video signal processor, the chip for a video signal processor is connected to a power divider having two output interfaces respectively connected to a display screen and a 4G communication module; a battery is connected to the optical receiver, the chip for a video signal processor, the power divider, the display screen, the 4G communication module, and a global positioning system (GPS) module.

9 Claims, 3 Drawing Sheets

(56) References Cited

U.S. PATENT DOCUMENTS

| | | | |
|---|---|---|---|
| 2005/0040262 A1* | 2/2005 | Nagai | B05B 5/0407 239/690 |
| 2006/0102741 A1* | 5/2006 | Cesak | G01P 13/0086 239/69 |
| 2009/0078801 A1* | 3/2009 | Takahashi | B05B 5/1608 239/700 |
| 2009/0179081 A1* | 7/2009 | Charpie | B05B 12/124 239/289 |
| 2015/0251199 A1* | 9/2015 | Mickols | B05B 5/0532 239/690 |
| 2016/0050852 A1* | 2/2016 | Lee | H04N 7/18 901/41 |

* cited by examiner

VISUAL INSULATING SPRAY LANCE FOR LIVE WORKING

RELATED APPLICATIONS

The present invention is a Nonprovisional Application under 35 USC 111(a), claiming priority to Serial No. CN 201910976695.X, filed on 15 Oct. 2019, the entirety of which is incorporated herein by reference.

TECHNICAL FIELD

The present invention relates to the field of sprays for external insulation of electrical equipment, in particular to a visual insulating spray lance for live working.

BACKGROUND

With the development of economy, there are more unknown pollution sources. For example, original level-I or level-II pollution is serious due to human factors such as building of cement plants or chemical plants, demolition, road construction, or the like. As a result, the antifouling property is greatly reduced, and pollution flashover is extremely likely to occur especially under special weather conditions such as humid atmospheres, heavy fogs, dewing, drizzling. Room temperature vulcanizing (RTV) silicone coatings as anti-pollution flashover coatings frequently used by power sectors have excellent hydrophobicity and migration of hydrophobicity and can effectively reduce the probability of the pollution flashover occurring on electrical equipment when sprayed on the surfaces of insulators. Most existing anti-pollution flashover coatings for the electrical equipment are sprayed during power cuts. However, with the development of society, requirements on reliability of power supply are increasingly high, and power-off maintenance is increasingly unfeasible for the power sectors. Especially once a key station is off, there are many adverse consequences. Different sprays may be simultaneously performed within precious power-off time due to limited time and heavy tasks, in this case, different operation will be influenced mutually, and insufficient spraying thicknesses or missing sprays are inevitable in the spraying process of RTV, resulting in poor spraying effects. An RTV spraying technology for live working as an emerging technology can be used to spray anti-pollution flashover coatings during normal operation of the equipment without being limited by the power-off time, thus effectively avoiding the conflict between economic benefits of the power supply and safe operation of the equipment. Due to the limitation of a current detection technology, sprays of the RTV on the power-on equipment cannot be viewed at the vicinity of the power-on equipment, and common electrical equipment is complicated in structure, in this case, dead angles appear and cannot be viewed on the ground. Consequentially, nonuniform spraying thicknesses and missing sprays are caused, operation units and owner units cannot control spray qualities, and the sprays depend on experience of operators to a greater extent. In view of this, it is an emergency to develop a spray device for spraying power-on electrical equipment to realize external insulation of the electrical equipment, which can achieve real-time local monitoring on the spray qualities as well as remote data sharing.

SUMMARY

The objective of the present invention is to overcome the defects of the prior art by providing a visual insulating spray lance for live working, which can effectively solve the problems that sprays on electrical equipment cannot be viewed in real time and the spray quality is not ideal.

To achieve the above objective, the present invention adopts the following technical solution: a visual insulating spray lance for live working includes a spray nozzle and an operating rod, where the operating rod with a top opening and a bottom opening is hollow, a liquid guide tube and an air tube in the hollow operating rod stretch out of two ends of the operating rod and have outlet ends stretching out of the upper end of the operating rod, a connecting tube inserted into the upper end of the operating rod is communicated with an inlet of the spray nozzle, an upward connecting rod is hinged to the upper portion of the operating rod through a first fastener and has an upper end fixedly provided with a video optical transceiver, a display is fixedly arranged on the lower portion of the operating rod through a second fastener, an optical fiber is arranged in an internal cavity of the connecting rod and an optical fiber tube in an internal cavity of the operating rod, and the video optical transceiver is connected to the display through the optical fiber; and the display includes a shell and an internal circuit including an optical receiver, a chip for a video signal processor, a power divider, a display screen, and a 4G communication module, where the optical fiber is connected to the optical receiver via a fiber channel (FC) interface, the chip for a video signal processor has an input terminal connected to a signal output terminal of the optical receiver as well as an output terminal connected to an input terminal of the power divider, two output interfaces of the power divider are respectively connected to an interface of the display screen as well as an RS232 interface of the 4G communication module, a battery is connected to the optical receiver, the chip for a video signal processor, the power divider, the display screen, a power terminal of the 4G communication module, and a power terminal of a global positioning system (GPS) module, and a charging port connected to the battery is formed in the shell.

The present invention is simple in structure, novel and unique in design, convenient to operate, can achieve real-time local monitoring and remote monitoring on the spraying situation of the electrical equipment, effectively solves the problems that electrical equipment is required to be power-off when sprayed with RTV silicone and the spray quality is not ideal, thus being innovative compared with spray lances for electrical equipment and having remarkable social and economic benefits.

DETAILED DESCRIPTION

Figure 1:
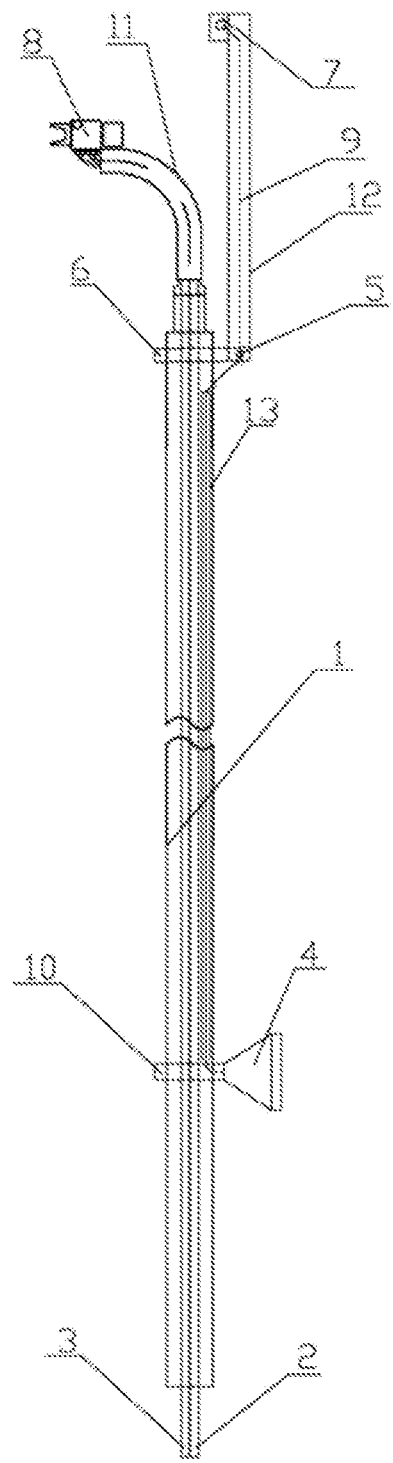
FIG. 1 is a structural diagram of the present invention.
Figure 2:
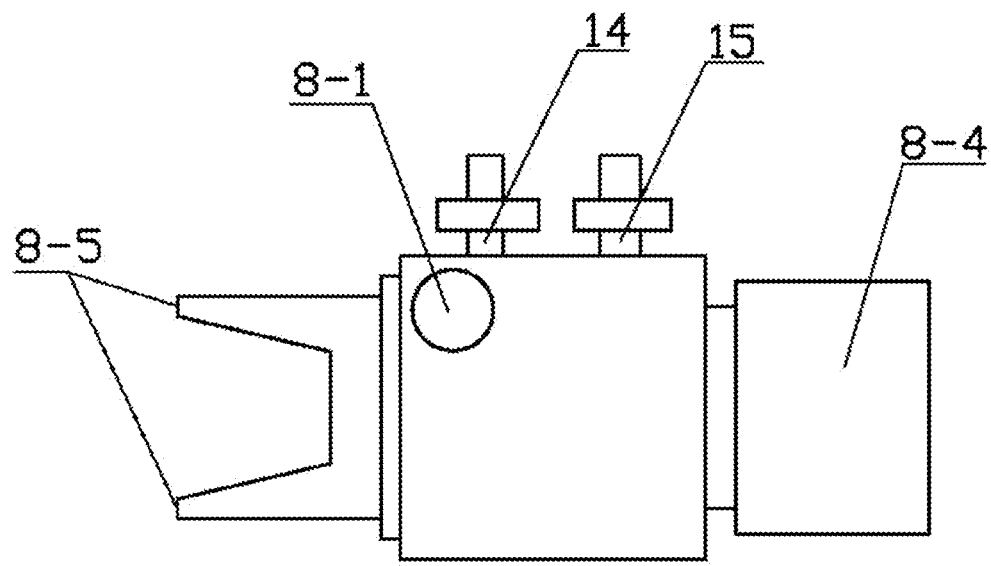
FIG. 2 is a front view of a spray nozzle in the present invention.
Figure 3:
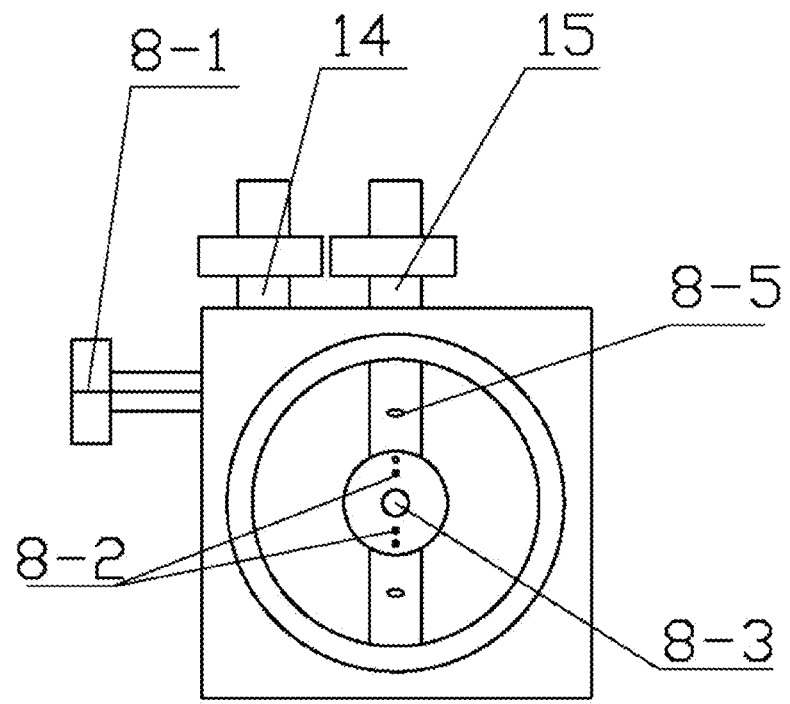
FIG. 3 is a side view of the spray nozzle in the present invention.
Figure 4:
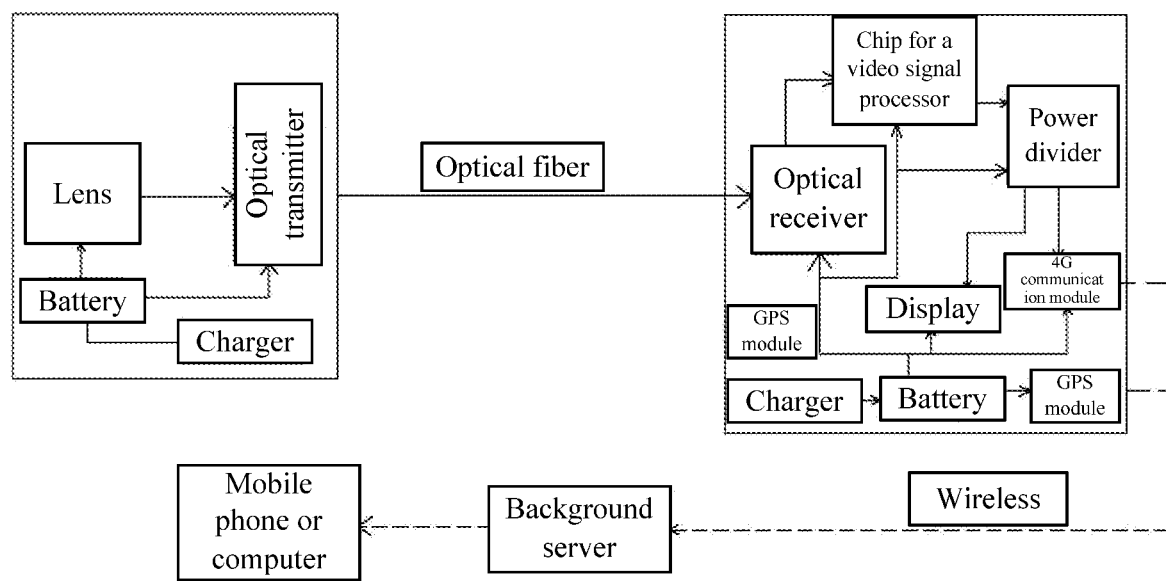
FIG. 4 is a transmission diagram of video information in the present invention.

The specific example of the present invention is expounded below with reference to the accompanying drawings and specific implementations.

With reference to the accompanying drawings, a visual insulating spray lance for live working of the present invention includes a spray nozzle and an operating rod, where the operating rod 1 with a top opening and a bottom opening is hollow, a liquid guide tube 2 and an air tube 3 in the hollow operating rod 1 stretch out of two ends of the operating rod 1 and have outlet ends stretching out of the upper end of the operating rod 1, a connecting tube 11 inserted into the upper end of the operating rod 1 is communicated with an inlet of the spray nozzle 8, an upward connecting rod 12 is hinged to the upper portion of the operating rod 1 through a first fastener 6 and has an upper end fixedly provided with a video optical transceiver 7, a display 4 is fixedly arranged on the lower portion of the operating rod 1 through a second fastener 10, an optical fiber 9 is arranged in an internal cavity of the connecting rod 12 and an optical fiber tube 13 in an internal cavity of the operating rod 1, and the video optical transceiver 7 is connected to the display 4 through the optical fiber 9; and the display 4 includes a shell and an internal circuit including an optical receiver, a chip for a video signal processor, a power divider, a display screen, and a 4G communication module, where the optical fiber 9 is connected to the optical receiver via a fiber channel (FC) interface, the chip for a video signal processor has an input terminal connected to a signal output terminal of the optical receiver as well as an output terminal connected to an input terminal of the power divider, two output interfaces of the power divider are respectively connected to an interface of the display screen as well as an RS232 interface of the 4G communication module, a battery is connected to the optical receiver, the chip for a video signal processor, the power divider, the display screen, a power terminal of the 4G communication module, and a power terminal of a GPS module, and a charging port connected to the battery is formed in the shell.

To make a spray effect better, the spray nozzle 8 includes a spray nozzle body and a button 8-4 for adjusting a liquid level, where a button 8-1 for adjusting the shape of a liquid column is arranged on the spray nozzle body; the liquid guide tube 2 and the air tube 3 are respectively communicated with a liquid inlet 14 and an air inlet 15 through a connector having two threaded ends; air outlets 8-2, a liquid outlet 8-3, and auxiliary air inlets 8-5 are formed in the side face of the spray nozzle body.

304 hose clamps are used as the first fastener 6 and the second fastener 10 which are adjusted in size according to the operating rod 1.

The operating rod 1 with the top opening and the bottom opening and the arc connecting tube 11 are both hollow, and the arc connecting tube 11 has one end in threaded connection with the upper portion of the operating rod 1 through a connector having two threaded ends as well as the other end fixedly provided with the spray nozzle 8.

All parts of the visual insulating spray lance for live working are made from highly insulating materials.

An inlet end of the air tube 3 is communicated with an air outlet of an air compressor, and an inlet end of the liquid guide tube 2 is communicated with an outlet end of a liquid tube.

Openings are respectively formed in the lower end of the connecting rod 12 and the upper end of the operating rod 1, the optical fiber 9 stretches out of the opening in the lower end of the connecting rod 12 to enter the optical fiber tube 13 in the internal cavity of the operating rod 1, and the display 4 is connected to the video optical transceiver 7 through the optical fiber 9 and is arranged on the lower portion of the operating rod 1 through the second fastener 10 for convenient observation.

An APPRE-T/R1ZV0FD optical receiver, an MS1850 chip, a PD-0109 or PD-0R413 power divider, a 4-8 inch display with a low voltage differential signaling (LVDS) interface, a 4G communication module with a USR-G780 V2 or RS232 interface, and an SKG08A GPS module are respectively used as the optical receiver, the chip for a video signal processor, the power divider, the display, the 4G communication module, and the GPS module which are mentioned above.

The video optical transceiver 7 is composed of a shell as well as a camera, an optical transmitter, a battery, and a charger in the shell, where an APPRE-T/R1ZV0FD optical transmitter is used as the optical transmitter and has an interface connected to the camera through a video cable; the battery is connected to the camera and a power terminal of the optical transmitter; and a charging port connected to the battery is formed in the shell. Video data acquired by a camera lens is transmitted to the optical transmitter, which in turn transmits the video data to the display 4 by the means of the optical fiber 9.

An HD-SDI optical transmitter is used as the video optical transceiver 7.

It should be noted that the camera, the optical transmitter, the battery, the charger, the optical receiver, the chip for a video signal processor, the power divider, the display screen, and the 4G communication module are well-known and commercially available.

The present invention is particularly operated as follows: the inlet end of the liquid guide tube is manually communicated with the outlet end of the liquid tube, the inlet end of the air tube is manually communicated with the air outlet of the air compressor, and the spray lance is held with a hand to spray power-on electrical equipment in an air-liquid mixing manner; the connecting rod is hinged to the first fastener and thus can be manually adjusted at different angles as required to facilitate the video optical transceiver to acquire the video data; the battery in the HD-SDI optical transmitter and the battery in the display can be shown by opening a power supply of the HD-SDI optical transmitter and a power supply of the display and supply power for 1-2 hours; the camera of the HD-SDI optical transmitter acquires the video data in real time to shoot a 1080P high definition (HD) video with a time lapse less than 300 ms, an acquired signal is transmitted to the display by means of the optical fiber, the optical receiver acquires the video in real time, and the chip for a video signal processor transmits the video in two ways by means of the power divider; in one way, the video is directly displayed as a real-time image on a 6-inch display screen with an LVDS interface by converting a serial digital interface (SDI) signal into a low voltage differential signal (LVDS); in the other way, the video is subjected to H.265 encoding and compression and then is transmitted to a background sever by means of 4G communication to be finally played on an HD mobile phone or an HD computer, so that the purpose of remote data sharing is achieved. The shot video can be stored in an embedded multi-media card (EMMC) in the computer or the mobile phone; the display has a GPS function, so that the on-line situation of the equipment, construction position and time, and the like can be viewed in real time on the background server in combination with a geographic information system (GIS) map; and the camera and the display which are waterproof at an IP54 grade can be used for outdoor working.

Compared with the prior art, the present invention combines the intelligent management with mechanical operation, is novel, unique, simple and proper in structure and convenient to operate, saves the time and labor, has excellent cleaning effect, guarantees safety in live working because all the parts are made from the highly insulating materials, can make all spray links of RTV silicone be viewed, directly transmits initial data from the video to the display by means of the optical fiber to make the display directly display the video after an optical signal is converted into a digital signal, thus saving the time for processing the video; and moreover, the present invention effectively solves the problems that he electrical equipment is required to be power-off when sprayed with RTV and the spray quality is not ideal, thus being innovative compared with spray lances for electrical equipment and having remarkable social and economic benefits.

What is claimed is:

1. A visual insulating spray lance for live working, comprising:
    a spray nozzle having an inlet;
    a hollow operating rod, the hollow operating rod including a top opening and a bottom opening;
    a liquid guide tube arranged in the hollow operating rod, the liquid guide tube having an outlet end extending out of the top opening of the hollow operating rod and an opposite end extending out of the bottom opening;
    an air tube arranged in the hollow operating, the air tube having an outlet end extending out of the top opening of the hollow operating tube and an opposite end extending out of the bottom opening;
    a connecting tube inserted into an upper end of the hollow operating rod, the connecting tube communicating with the inlet of the spray nozzle;
    an upward connecting rod connectively hinged to an upper portion of the hollow operating rod via a first fastener, the upward connecting rod having an upper end fixedly provided with a video optical transceiver;
    a display fixedly arranged on a lower portion of the hollow operating rod via a second fastener, the display comprising a shell and an internal circuit, the internal circuit comprising an optical receiver, a chip for a video signal processor, a power divider, a display screen, and a 4G communication module, wherein the chip for the video signal processor has an input terminal connected to a signal output terminal of the optical receiver and an output terminal connected to an input terminal of the power divider, two output interfaces of the power divider are respectively connected to an interface of the display screen and an RS232 interface of the 4G communication module;
    an optical fiber tube arranged in the hollow operating rod;
    an optical fiber arranged in an internal cavity of the upward connecting rod and in the optical fiber tube, the optical fiber connecting the video optical transceiver to the display,
    the optical fiber being connected to the optical receiver via a fiber channel (FC) interface;
    a battery connected to the optical receiver, the chip for a video signal processor, the power divider, the display screen, a power terminal of the 4G communication module, and a power terminal of a global positioning system (GPS) module; and
    a charging port connected to the battery is formed in the shell.

2. The visual insulating spray lance for live working according to claim 1, wherein the spray nozzle comprises a spray nozzle body and a button for adjusting a liquid level, wherein a button for adjusting a shape of a liquid column is arranged on the spray nozzle body; the liquid guide tube and the air tube are respectively communicated with a liquid inlet and an air inlet through a first connector having two threaded ends; an air outlet, a liquid outlet, and an auxiliary air inlet are formed in a side face of the spray nozzle body.

3. The visual insulating spray lance for live working according to claim 1, wherein stainless steel hose clamps are used as the first fastener and the second fastener.

4. The visual insulating spray lance for live working according to claim 1, wherein the connecting tube is hollow, and the connecting tube has an end in threaded connection with the upper portion of the hollow operating rod through a second connector having two threaded ends and another end fixedly provided with the spray nozzle.

5. The visual insulating spray lance for live working according to claim 1, wherein all parts of the visual insulating spray lance for live working are made from insulating materials.

6. The visual insulating spray lance for live working according to claim 1, wherein an inlet end of the air tube is communicated with an air outlet of an air compressor, and an inlet end of the liquid guide tube is communicated with an outlet end of a liquid tube.

7. The visual insulating spray lance for live working according to claim 1, wherein a first opening is formed in a lower end of the connecting rod and a second opening is formed in the upper end of the hollow operating rod, the optical fiber stretches out of the first opening in the lower end of the connecting rod to enter the optical fiber tube in the internal cavity of the hollow operating rod through the second opening, and the display is connected to the video optical transceiver through the optical fiber and is arranged on the lower portion of the hollow operating rod through the second fastener for convenient observation.

8. The visual insulating spray lance for live working according to claim 1, wherein a 4-8 inch display with a low voltage differential signaling (LVDS) interface, a 4G communication module with an RS232 interface are respectively used as the display and the 4G communication module.

9. The visual insulating spray lance for live working according to claim 1, wherein the video optical transceiver comprises a shell, a camera, an optical transmitter, a battery, and a charger arranged in the shell of the video optical transceiver, wherein the optical transmitter has an interface connected to the camera through a video cable; the battery is connected to the camera and a power terminal of the optical transmitter; the charging port connected to the battery is formed in the shell of the video optical transceiver; and video data acquired by a camera lens is transmitted to the optical transmitter, which transmits the video data to the display via the optical fiber.

* * * * *